United States Patent
Lubomirsky et al.

(10) Patent No.: US 8,357,435 B2
(45) Date of Patent: Jan. 22, 2013

(54) FLOWABLE DIELECTRIC EQUIPMENT AND PROCESSES

(75) Inventors: Dmitry Lubomirsky, Cupertino, CA (US); Qiwei Liang, Fremont, CA (US); Jang Gyoo Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1044 days.

(21) Appl. No.: 12/210,982

(22) Filed: Sep. 15, 2008

(65) Prior Publication Data

US 2009/0280650 A1  Nov. 12, 2009

Related U.S. Application Data

(60) Provisional application No. 61/052,080, filed on May 9, 2008.

(51) Int. Cl.
*H05H 1/24* (2006.01)
*C23C 16/00* (2006.01)

(52) U.S. Cl. .................. 427/569; 118/719; 118/723 MP

(58) Field of Classification Search .................. 427/569
See application file for complete search history.

(56) References Cited

U.S. PATENT DOCUMENTS

| | | | |
|---|---|---|---|
| 4,147,571 A | 4/1979 | Stringfellow et al. |
| 4,200,666 A | 4/1980 | Reinberg |
| 4,816,098 A | 3/1989 | Davis et al. |
| 4,818,326 A | 4/1989 | Liu et al. |
| 4,931,354 A | 6/1990 | Wakino et al. |
| 4,946,593 A | 8/1990 | Pinigis |
| 5,016,332 A | 5/1991 | Reichelderfer et al. |
| 5,110,407 A | 5/1992 | Ono et al. |
| 5,271,972 A | 12/1993 | Kwok et al. |
| 5,279,784 A | 1/1994 | Bender et al. |

(Continued)

FOREIGN PATENT DOCUMENTS

DE  19654737 A1  3/1997

(Continued)

OTHER PUBLICATIONS

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

(Continued)

*Primary Examiner* — Timothy Meeks
*Assistant Examiner* — Mandy Louie
(74) *Attorney, Agent, or Firm* — Kilpatrick Townsend & Stockton LLP

(57) ABSTRACT

Methods of depositing and curing a dielectric material on a substrate are described. The methods may include the steps of providing a processing chamber partitioned into a first plasma region and a second plasma region, and delivering the substrate to the processing chamber, where the substrate occupies a portion of the second plasma region. The methods may further include forming a first plasma in the first plasma region, where the first plasma does not directly contact with the substrate, and depositing the dielectric material on the substrate to form a dielectric layer. One or more reactants excited by the first plasma are used in the deposition of the dielectric material. The methods may additional include curing the dielectric layer by forming a second plasma in the second plasma region, where one or more carbon-containing species is removed from the dielectric layer.

5 Claims, 16 Drawing Sheets

U.S. PATENT DOCUMENTS

| | | | |
|---|---|---|---|
| 5,393,708 A | 2/1995 | Hsia et al. |
| 5,426,076 A | 6/1995 | Moghadam |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Leychika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,935,340 A | 8/1999 | Xia et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,207,587 B1 | 3/2001 | Li et al. |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Kahn et al. |
| 6,589,868 B2 | 7/2003 | Rossman |
| 6,596,654 B1 | 7/2003 | Bayman et al. |
| 6,599,839 B1 * | 7/2003 | Gabriel et al. ................ 438/705 |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,849,520 B2 | 2/2005 | Kim et al. |
| 6,858,523 B2 | 2/2005 | Deboer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,890,403 B2 | 5/2005 | Cheung |
| 6,900,067 B2 | 5/2005 | Kobayashi et al. |
| 6,955,836 B2 | 10/2005 | Kumagi et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 8,129,555 B2 | 3/2012 | Cheng et al. |
| 8,236,708 B2 | 8/2012 | Kweskin et al. |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 * | 12/2001 | Iyer ................................ 438/758 |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0086166 A1 | 7/2002 | Hendricks et al. |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0164429 A1 | 11/2002 | Gaillard et al. |
| 2002/0164891 A1 | 11/2002 | Gates et al. |

| Publication No. | Date | Inventor |
|---|---|---|
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Tois et al. |
| 2004/0079118 A1 | 4/2004 | M'Saad et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0194706 A1 | 10/2004 | Wang et al. |
| 2004/0216844 A1 | 11/2004 | Janakiraman et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1* | 4/2005 | Yuda et al. ............. 118/723 ME |
| 2005/0118794 A1 | 6/2005 | Babayan et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196977 A1 | 9/2005 | Saito et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2006/0011984 A1 | 1/2006 | Curie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0281496 A1 | 12/2006 | Cedraeus |
| 2006/0286776 A1 | 12/2006 | Ranish et al. |
| 2007/0004170 A1 | 1/2007 | Kawasaki et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281495 A1 | 12/2007 | Mallick et al. |
| 2007/0281496 A1 | 12/2007 | Ingle et al. |
| 2008/0000423 A1 | 1/2008 | Fukiage |
| 2008/0026597 A1 | 1/2008 | Munro et al. |
| 2008/0063809 A1 | 3/2008 | Lee et al. |
| 2008/0081104 A1 | 4/2008 | Hasebe et al. |
| 2008/0085607 A1 | 4/2008 | Yu et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0061647 A1 | 3/2009 | Mallick et al. |
| 2009/0075490 A1 | 3/2009 | Dussarrat et al. |
| 2009/0095714 A1* | 4/2009 | Chen et al. ...................... 216/67 |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0194809 A1 | 8/2009 | Cho |
| 2009/0203225 A1 | 8/2009 | Gates et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0081293 A1 | 4/2010 | Mallick et al. |
| 2010/0140756 A1 | 6/2010 | Kozasa et al. |
| 2010/0221428 A1 | 9/2010 | Dussarrat |
| 2010/0221925 A1 | 9/2010 | Lee et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0217851 A1 | 9/2011 | Liang et al. |
| 2011/0223774 A1 | 9/2011 | Kweskin et al. |
| 2012/0009802 A1 | 1/2012 | LaVoie et al. |
| 2012/0083133 A1 | 4/2012 | Solis et al. |
| 2012/0094468 A1 | 4/2012 | Bhatia et al. |
| 2012/0111831 A1 | 5/2012 | Ha |

| | | | |
|---|---|---|---|
| 2012/0142192 | A1 | 6/2012 | Li et al. |
| 2012/0190178 | A1 | 7/2012 | Wang et al. |
| 2012/0213940 | A1 | 8/2012 | Mallick |

FOREIGN PATENT DOCUMENTS

| | | |
|---|---|---|
| EP | 0892083 A1 | 1/1999 |
| EP | 1095958 B1 | 5/2001 |
| EP | 1717848 A | 11/2006 |
| JP | 64-048425 A | 2/1989 |
| JP | 01-235259 A | 9/1989 |
| JP | 01241826 A | 9/1989 |
| JP | 03-286531 | 12/1991 |
| JP | 05-259156 | 10/1993 |
| JP | 05-304147 A | 11/1993 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 11-274285 A | 10/1999 |
| JP | 2001-148382 A | 5/2001 |
| JP | 2002-370059 A | 12/2002 |
| JP | 2004-327639 | 11/2004 |
| JP | 2008-159824 A | 7/2008 |
| JP | 2008/218684 A | 9/2008 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |
| KR | 1020060081350 A | 7/2006 |
| KR | 10-2009-0011765 A | 2/2009 |
| KR | 10-2009-0122860 A | 12/2009 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |
| WO | 2009/055340 A1 | 4/2009 |

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI. The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

PCT International Search Report and Written Opinion mailed Apr. 12, 2010; International Application No. PCT/US2009/055073, 12 pages.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

EP Search Report mailed Jun. 9, 2009; Application No. 08167338.6, 9 pages.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, Ch. vol. 205, No. 2, Dec. 1, 1991, pp. 246-251.

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

Bowen, C., et al., "New Processing Techniques: Sweeping of Quartz Wafers and A Practical Method for Processing Quartz Resonators Under Controlled Conditions," Proceedings of the 1992 IEEE Frequency Control Symposium, pp. 648-656.

International Search Report and Written Opinion of PCT/US2011/054981, mailed May 9, 2012, 10 pages.

International Search Report and Written Opinion of PCT/US2011/054984, mailed May 11, 2012, 10 pages.

Loboda, M.J., et al., "Chemical influence of inert gas on the thin film stress in plasma-enhanced chemical vapor deposited a-SiN:H films". Journal of Materials Research, vol. 11, No. 2, Feb. 1996, pp. 391-398.

International Search Report and Written Opinion of PCT/US2011/054635, mailed Jul. 9, 2012, 11 pages.

International Search Report and Written Opinion of PCT/US2011/066601, mailed Jul. 20, 2012, 10 pages.

\* cited by examiner

FLOWABLE DIELECTRIC EQUIPMENT AND PROCESSES

CROSS-REFERENCES TO RELATED APPLICATIONS

This application claims the benefit of U.S. Provisional Patent Application No. 61/052,080 field May 9, 2008. This application is also related to U.S. patent application Ser. No. 11/754,858, filed May 29, 2007, and titled "PROCESS CHAMBER FOR DIELECTRIC GAPFILL." The entire contents of both applications are herein incorporated by reference for all purposes.

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND

A conventional semiconductor processing system contains one or more processing chambers and a means for moving a substrate between them. A substrate may be transferred between chambers by a robotic arm which can extend to pick up the substrate, retract and then extend again to position the substrate in a different destination chamber. FIG. 1 shows a schematic of a substrate processing chamber. Each chamber has a pedestal shaft 105 and pedestal 110 or some equivalent way of supporting the substrate 115 for processing.

A pedestal can be a heater plate in a processing chamber configured to heat the substrate. The substrate may be held by a mechanical, pressure differential or electrostatic means to the pedestal between when a robot arm drops off the substrate and when an arm returns to pick up the substrate. Lift pins are often used to elevate the wafer during robot operations.

One or more semiconductor fabrication process steps are performed in the chamber, such as annealing the substrate or depositing or etching films on the substrate. Dielectric films are deposited into complex topologies during some processing steps. Many techniques have been developed to deposit dielectrics into narrow gaps including variations of chemical vapor deposition techniques which sometimes employ plasma techniques. High-density plasma (HDP)-CVD has been used to fill many geometries due to the perpendicular impingement trajectories of the incoming reactants and the simultaneous sputtering activity. Some very narrow gaps, however, have continued to develop voids due, in part, to the lack of mobility following initial impact. Reflowing the material after deposition can fill the void but, if the dielectric has a high reflow temperature (like $SiO_2$), the reflow process may also consume a non-negligible portion of a wafer's thermal budget.

By way of its high surface mobility, flow-able materials such as spin-on glass (SOG) have been useful in filling some of the gaps which were incompletely filled by HDP-CVD. SOG is applied as a liquid and cured after application to remove solvents, thereby converting material to a solid glass film. The gap-filling (gapfill) and planarization capabilities are enhanced for SOG when the viscosity is low. Unfortunately, low viscosity materials may shrink significantly during cure. Significant film shrinkage results in high film stress and delamination issues, especially for thick films.

Separating the delivery paths of two components can produce a flowable film during deposition on a substrate surface. FIG. 1 shows a schematic of a substrate processing system with separated delivery channels 125 and 135. An organosilane precursor may be delivered through one channel and an oxidizing precursor may be delivered through the other. The oxidizing precursor may be excited by a remote plasma 145. The mixing region 120 of the two components occurs closer to the substrate 115 than alternative processes utilizing a more common delivery path. Since the films are grown rather than poured onto the surface, the organic components needed to decrease viscosity are allowed to evaporate during the process which reduces the shrinkage affiliated with a cure step. Growing films this way limits the time available for adsorbed species to remain mobile, a constraint which may result in deposition of nonuniform films. A baffle 140 may be used to more evenly distribute the precursors in the reaction region.

Gapfill capabilities and deposition uniformity benefit from high surface mobility which correlates with high organic content. Some of the organic content may remain after deposition and a cure step may be used. The cure may be conducted by raising the temperature of the pedestal 110 and substrate 115 with a resistive heater embedded in the pedestal.

BRIEF SUMMARY

Embodiments of the invention include methods of depositing and curing a dielectric material on a substrate. The methods may include the steps of providing a processing chamber partitioned into a first plasma region and a second plasma region, and delivering the substrate to the processing chamber, where the substrate occupies a portion of the second plasma region. The methods may further include forming a first plasma in the first plasma region, where the first plasma does not directly contact with the substrate, and depositing the dielectric material on the substrate to form a dielectric layer. One or more reactants excited by the first plasma are used in the deposition of the dielectric material. The methods may additional include curing the dielectric layer by forming a second plasma in the second plasma region, wherein one or more carbon-containing species is removed from the dielectric layer.

Embodiments of the invention also include methods of depositing a film on a substrate disposed in a processing chamber. The methods may include the steps of flowing a first process gas mixture into a substrate processing region to form a film on the substrate. The methods may also include flowing a treatment gas through a plasma, through a showerhead, and into the substrate processing region to remove undesirable components from the film during growth.

Embodiments of the invention still further include methods of cleaning interior surfaces of a processing chamber partitioned by a showerhead into a first plasma region and a second plasma region. The methods may include the steps of flowing a treatment gas into the first plasma region, igniting a plasma in the first plasma region, and igniting a plasma in the second plasma region.

Embodiments of the invention may also include substrate processing systems that have a processing chamber and a substrate support assembly at least partially disposed within the chamber. Two gases (or two combinations of gases) are delivered to the substrate processing chamber by different paths. A process gas can be delivered into the processing chamber, excited in a plasma in a first plasma region, and pass through a showerhead into a second plasma region where it interacts with a silicon-containing gas and forms a film on the surface of a substrate. A plasma may be ignited in either the first plasma region or the second plasma region.

Choosing the orientation arbitrarily, the process gas can be introduced through a top of the processing chamber which forms a top plasma electrode. The showerhead forms a middle plasma electrode and the bottom of the processing chamber and/or the pedestal form the bottom electrode. The middle electrode can be chosen to substantially match the top or the bottom electrodes thereby determining the location of the plasma. During deposition, a plasma is ignited with the top and middle electrodes to form a plasma in the first plasma region. The potential of the middle electrode may be chosen to substantially match the top electrode, thereby creating a plasma in the second plasma region. A plasma in the second plasma region may help cure a deposited film but can also be used to clean the chamber. During a cleaning process, the gas present in the second plasma region may contain fluorine.

The process gas may contain oxygen, hydrogen and/or nitrogen (e.g. oxygen ($O_2$), ozone ($O_3$), $N_2O$, NO, $NO_2$, $NH_3$, $N_xH_y$ including $N_2H_4$, silane, disilane, TSA, DSA, etc.), and after it passes the showerhead, it is combined with a silicon-containing precursor (e.g. silane, disilane, TSA, DSA, TEOS, OMCTS, TMDSO, etc.) and introduced into the second plasma region. The combination of reactants forms a film of film on a substrate. The film may be silicon oxide, silicon nitride, silicon oxycarbide or silicon oxynitride.

Embodiments may also include introducing a treatment gas such as oxygen ($O_2$), ozone ($O_3$), $N_2O$, NO, $NO_2$, $N_xH_y$, including $N_2H_4$, $H_2$, $N_2$, $NH_3$, and water vapor. The treatment gas may be introduced from the top of the processing chamber and excited in the first plasma region. Alternatively, the gas may be excited by a remote plasma before entering the first plasma region. This gas does not contribute appreciably to the film growth, but may be used to reduce hydrogen, carbon and fluorine content of the film while it is being grown or following growth. Hydrogen and nitrogen radicals induce a reduction in undesirable components of the growing film. Excited derivatives of the treatment gas assist the film by scavenging carbon and other atoms from the growing lattice, thereby reducing the contraction exhibited during the cure and the film stress present afterward.

In further embodiments, a treatment gas is delivered through showerhead, after being excited in a remote plasma or a plasma in the first plasma region, to the second plasma region after a chamber maintenance procedure (clean and/or season) to remove residual fluorine from the interior of the processing chamber.

The two plasmas can be a variety of frequencies but will generally be in the radio frequency (RF) range. The plasmas can be inductively or capacitively coupled. All parts of the chamber including the showerhead may be cooled by flowing water or another coolant through channels made in the parts.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Where the reference label is used in the specification, the description is applicable to any one of the similar components having the same reference label.

DETAILED DESCRIPTION

Disclosed embodiments include substrate processing systems that have a processing chamber and a substrate support assembly at least partially disposed within the chamber. At least two gases (or two combinations of gases) are delivered to the substrate processing chamber by different paths. A process gas can be delivered into the processing chamber, excited in a plasma, and pass through a showerhead into a second plasma region where it interacts with a silicon-containing gas and forms a film on the surface of a substrate. A plasma can be ignited in either the first plasma region or the second plasma region.

Figure 2:
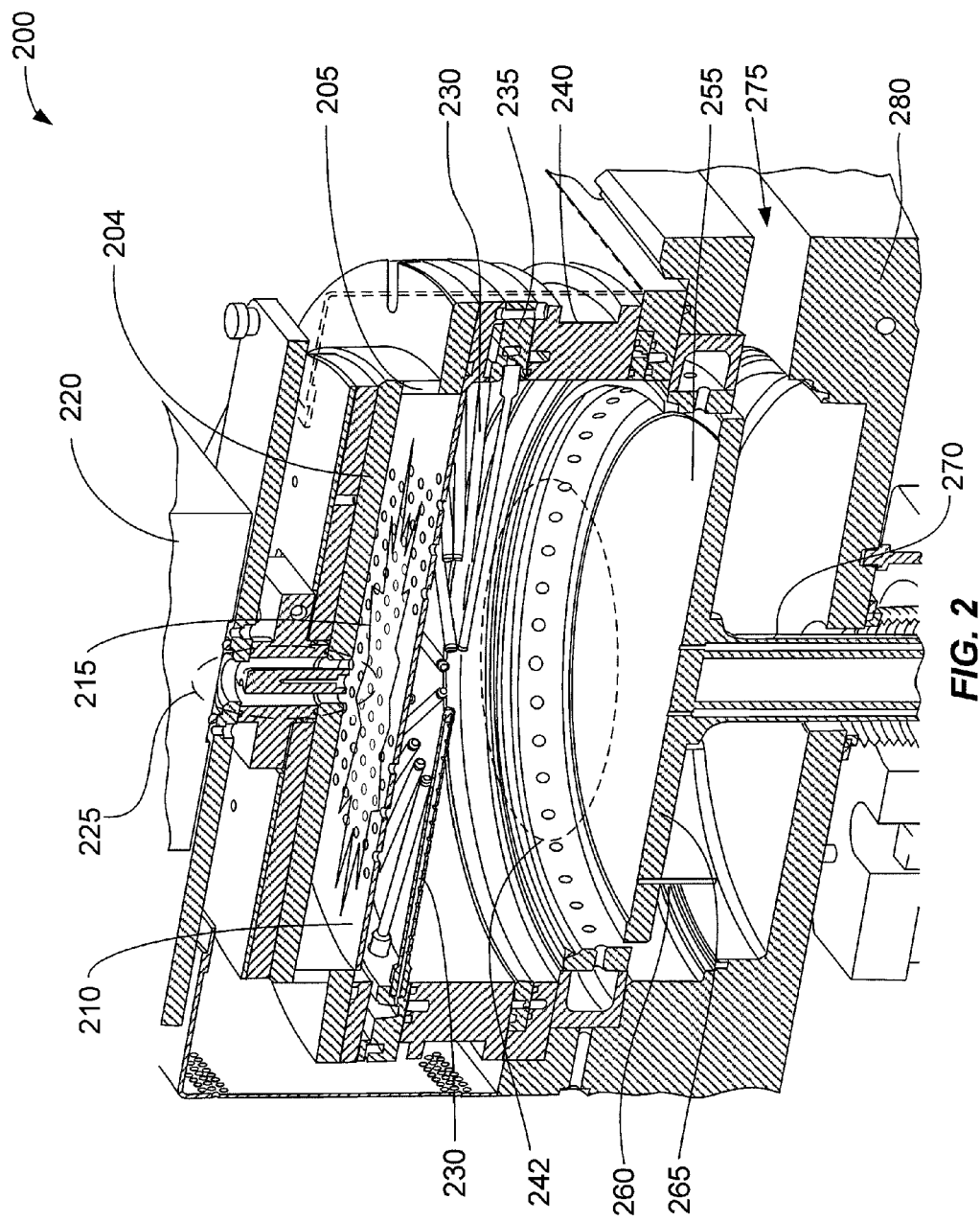
FIG. 2 is a perspective view of a process chamber with partitioned plasma generation regions according to disclosed embodiments.

FIG. 2 is a perspective view of a process chamber with partitioned plasma generation regions which maintain a separation between multiple gas precursors. A process gas containing oxygen, hydrogen and/or nitrogen (e.g. oxygen ($O_2$), ozone ($O_3$), $N_2O$, NO, $NO_2$, $NH_3$, $N_xH_y$ including $N_2H_4$, silane, disilane, TSA, DSA, . . . ) may be introduced through the gas inlet assembly 225 into a first plasma region 215. The first plasma region 215 may contain a plasma formed from the process gas. The process gas may also be excited prior to entering the first plasma region 215 in a remote plasma system (RPS) 220. Below the first plasma region 215 is a showerhead 210, which is a perforated partition (referred to herein as a showerhead) between the first plasma region 215 and a second plasma region 242. In embodiments, a plasma in the first plasma region 215 is created by applying AC power, possibly RF power, between a lid 204 and the showerhead 210, which may also be conducting.

In order to enable the formation of a plasma in the first plasma region, an electrically insulating ring 205 may be positioned between the lid 204 and the showerhead 210 to enable an RF power to be applied between the lid 204 and the showerhead 210. The electrically insulating ring 205 may be made from a ceramic and may have a high breakdown voltage to avoid sparking.

Figure 1:
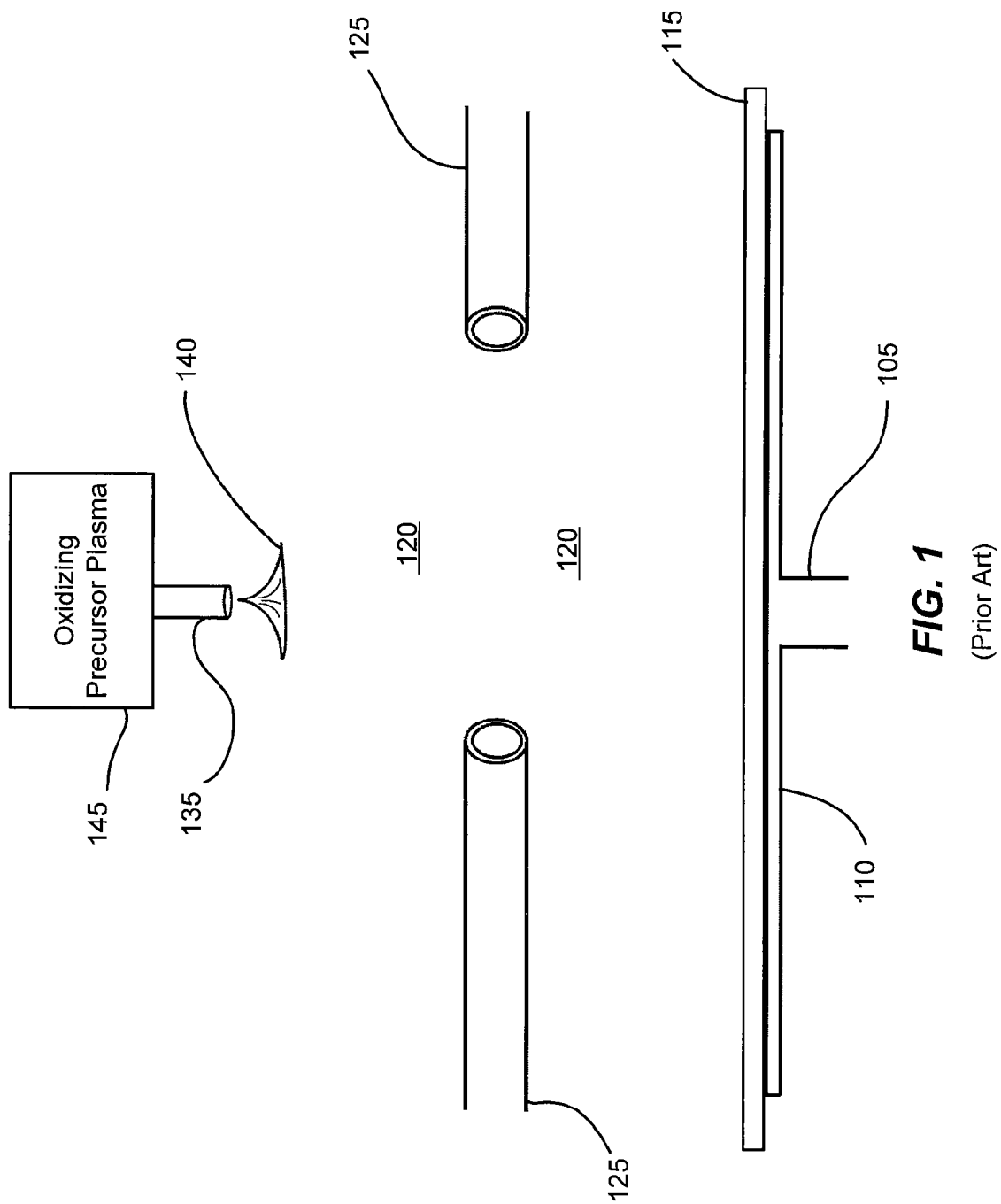
FIG. 1 is a schematic of a prior art processing region within a deposition chamber for growing films with separate oxidizing and organo-silane precursors.

The second plasma region 242 may receive excited gas from the first plasma region 215 through holes in the showerhead 210. The second plasma region 242 may also receive gases and/or vapors from tubes 230 extending from a side 235 of the processing chamber 200. The gas from the first plasma region 215 and the gas from the tubes 230 are mixed in the second plasma region 242 to process the substrate 255. Igniting a plasma in the first plasma region 215 to excite the process gas, may result in a more uniform distribution of excited species flowing into the substrate processing region (second plasma region 242) than a method relying only on the RPS 145 and baffle 140 of FIG. 1. In disclosed embodiments, there is no plasma in the second plasma region 242.

Processing the substrate 255 may include forming a film on the surface of the substrate 255 while the substrate is supported by a pedestal 265 positioned within the second plasma region 242. The side 235 of the processing chamber 200 may contain a gas distribution channel which distributes the gas to the tubes 230. In embodiments, silicon-containing precursors are delivered from the gas distribution channel through the tubes 230 and through an aperture at the end of each tube 230 and/or apertures along the length of the tubes 230.

Note that the path of the gas entering the first plasma region 215 from the gas inlet 225 can be interrupted by a baffle (not shown, but analogous to the baffle 140 of FIG. 1) whose purpose here is to more evenly distribute the gas in the first plasma region 215. In some disclosed embodiments, the process gas is an oxidizing precursor (which may containing oxygen ($O_2$), ozone ($O_3$), ...) and after flowing through the holes in the showerhead, the process gas may be combined with a silicon-containing precursor (e.g. silane, disilane, TSA, DSA, TEOS, OMCTS, TMDSO, ...) introduced more directly into the second plasma region. The combination of reactants may be used to form a film of silicon oxide ($SiO_2$) on a substrate 255. In embodiments the process gas contains nitrogen ($NH_3$, $N_xH_y$ including $N_2H_4$, TSA, DSA, $N_2O$, NO, $NO_2$, ...) which, when combined with a silicon-containing precursor may be used to form silicon nitride, silicon oxynitride or a low-K dielectric.

In disclosed embodiments, a substrate processing system is also configured so a plasma may be ignited in the second plasma region 242 by applying an RF power between the showerhead 210 and the pedestal 265. When a substrate 255 is present, the RF power may be applied between the showerhead 210 and the substrate 255. An insulating spacer 240 is installed between the showerhead 210 and the chamber body 280 to allow the showerhead 210 to be held at a different potential from the substrate 255. The pedestal 265 is supported by a pedestal shaft 270. A substrate 255 may be delivered to the process chamber 200 through a slit valve 275 and may be supported by lift pins 260 before being lowered onto the pedestal 265.

In the above description, plasmas in the first plasma region 215 and the second plasma region 242 are created by applying an RF power between parallel plates. In an alternative embodiment, either or both plasmas may be created inductively in which case the two plates may not be conducting. Conducting coils may be embedded within two electrically insulating plates and/or within electrically insulating walls of the processing chamber surrounding the region. Regardless of whether a plasma is capacitively coupled (CCP) or inductively coupled (ICP), the portions of the chamber exposed to the plasma may be cooled by flowing water through a cooling fluid channel within the portion. The shower head 210, the lid 204 and the walls 205 are water-cooled in disclosed embodiments. In the event that an inductively coupled plasma is used, the chamber may (more easily) be operated with plasmas in both the first plasma region and the second plasma region at the same time. This capability may be useful to expedite chamber cleaning.

Figure 3A:
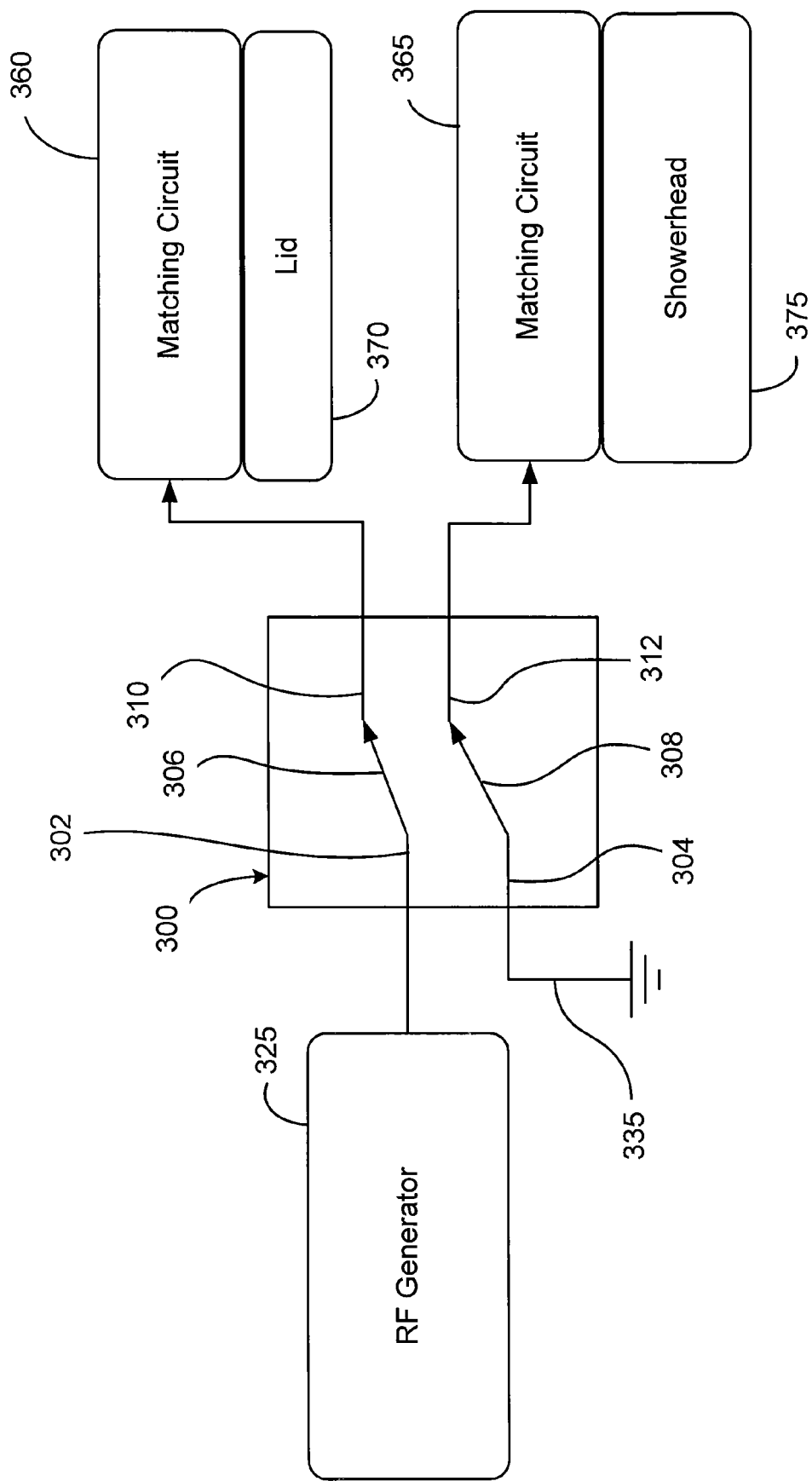
FIG. 3A is a schematic of an electrical switch box according to disclosed embodiments.
Figure 3B:
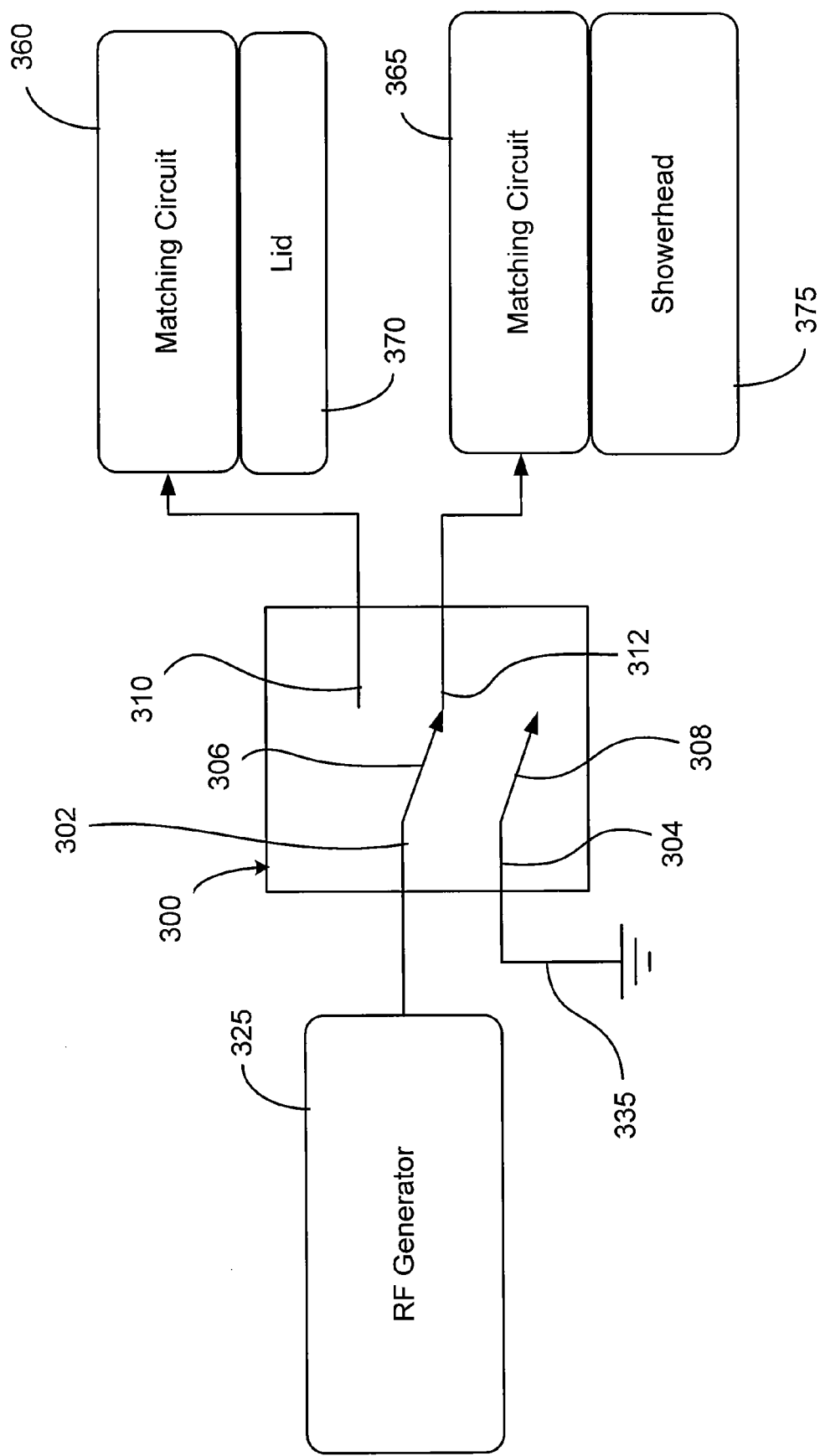
FIG. 3B is a schematic of an electrical switch box according to disclosed embodiments.

FIGS. 3A-B are electrical schematics of an electrical switch 300 which may result in a plasma in either the first plasma region or the second plasma region. In both FIGS. 3A and 3B the electrical switch 300 is a modified double-pole double-throw (DPDT). The electrical switch 300 can be in one of two positions. The first position is shown in FIG. 3A and the second position in FIG. 3B. The two connections on the left are electrical inputs to the processing chamber and the two connections on the right are output connections to components on the processing chamber. The electrical switch 300 may be located physically near or on the processing chamber but may also be distal to the processing chamber. The electrical switch 300 may be manually and/or automatically operated. Automatic operation may involve the use of one or more relays to change the status of the two contacts 306, 308. The electrical switch 300 in this disclosed embodiment is modified from a standard DPDT switch in that exactly one output 312 can be contacted by each of the two contacts 306, 308 and the remaining output can only be contacted by one contact 306.

The first position (FIG. 3A) enables a plasma to be created in the first plasma region and results in little or no plasma in the second plasma region. The chamber body, pedestal and substrate (if present) are typically at ground potential in most substrate processing systems. In disclosed embodiments, the pedestal is grounded regardless of the electrical switch 300 position. FIG. 3A shows a switch position which applies an RF power to the lid 370 and grounds (in other words applies 0 volts to) the showerhead 375. This switch position may correspond to the deposition of a film on the substrate surface.

The second position (FIG. 3B) enables a plasma to be created in the second plasma region. FIG. 3B shows a switch position which applies an RF power to the showerhead 375 and allows the lid 370 to float. An electrically floating lid 370 results in little or no plasma present in the first plasma region. This switch position may correspond to the treatment of a film after deposition or to a chamber cleaning procedure in disclosed embodiments.

Two impedance matching circuits 360, 365 appropriate for the AC frequency(s) output by the RF source and aspects of the lid 370 and showerhead 375 are depicted in both FIGS. 3A and 3B. The impedance matching circuits 360, 365 may reduce the power requirements of the RF source by reducing the reflected power returning to the RF source. Again, the frequencies may be outside the radio frequency spectrum in some disclosed embodiments.

Figure 4A:
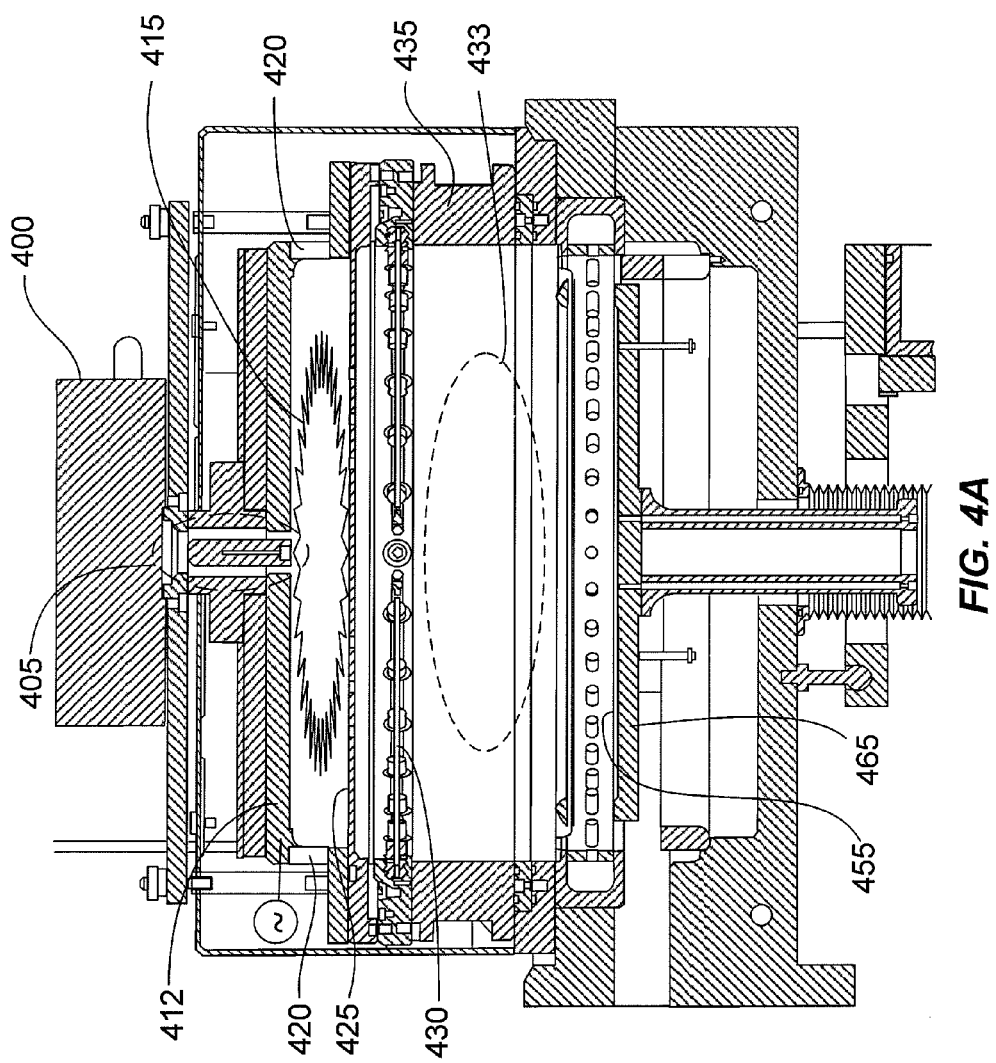
FIG. 4A is a cross-sectional view of a process chamber with partitioned plasma generation regions according to disclosed embodiments.
Figure 4B:
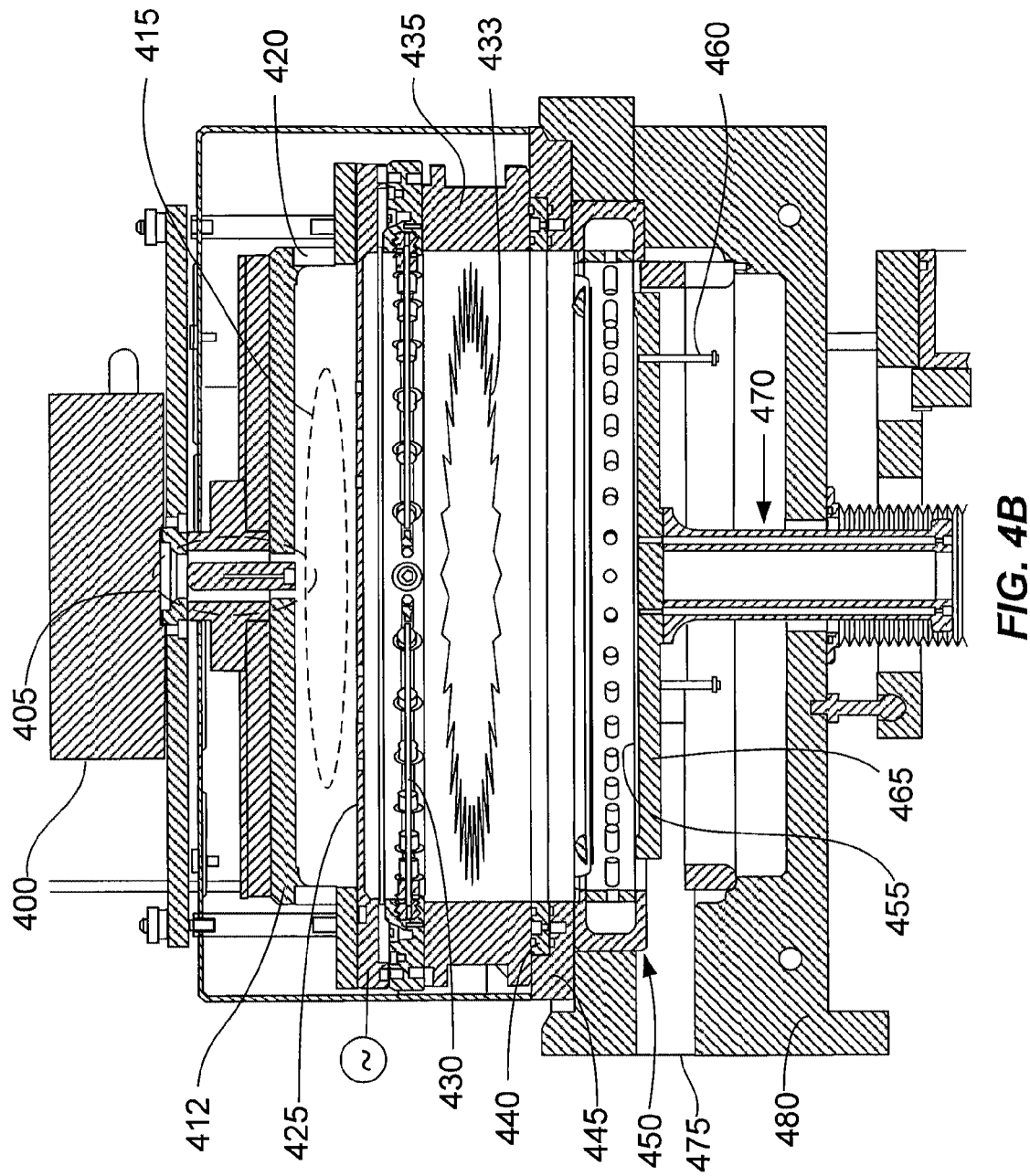
FIG. 4B is a cross-sectional view of a process chamber with partitioned plasma generation regions according to disclosed embodiments.

FIGS. 4A-B are cross-sectional views of a process chamber with partitioned plasma generation regions according to disclosed embodiments. During film deposition (silicon oxide, silicon nitride, silicon oxynitride or silicon oxycarbide), a process gas may be flowed into the first plasma region 415 through a gas inlet assembly 405. The process gas may be excited prior to entering the first plasma region 415 within a remote plasma system (RPS) 400. A lid 412 and showerhead 425 are shown according to disclosed embodiments. The lid 412 is depicted (FIG. 4A) with an applied AC voltage source and the showerhead is grounded, consistent with the first position of the electrical switch in FIG. 3A. An insulating ring 420 is positioned between the lid 412 and the showerhead 425 enabling a capacitively coupled plasma (CCP) to be formed in the first plasma region.

A silicon-containing precursor may be flowed into the second plasma region 433 through tubes 430 extending from the sides 435 of the processing chamber. Excited species derived from the process gas travel through holes in the showerhead 425 and react with the silicon-containing precursor flowing through the second plasma region 433. The diameter of holes in the showerhead 425 may be below 12 mm, may be between 0.25 mm and 8 mm, and may be between 0.5 mm and 6 mm in different embodiments. The thickness of the showerhead can vary quite a bit but the length of the diameter of the holes may be about the diameter of the holes or less, increasing the density of the excited species derived from the process gas within the second plasma region 433. Little or no plasma is present in the second plasma region 433 due to the position of the switch (FIG. 3A). Excited derivatives of the process gas and the silicon-containing precursor combine in the region above the substrate and, on occasion, on the substrate to form a flowable film on the substrate. As the film grows, more recently added material possesses a higher mobility than underlying material. Mobility decreases as organic content is reduced by evaporation. Gaps may be filled by the flowable film using this technique without leaving traditional densities of organic content within the film after deposition is completed. A curing step may still be used to further reduce or remove the organic content from a deposited film.

Exciting the process gas in the first plasma region 415 alone or in combination with the remote plasma system (RPS) provides several benefits. The concentration of the excited species derived from the process gas may be increased within the second plasma region 433 due to the plasma in the first plasma region 415. This increase may result from the location of the plasma in the first plasma region 415. The second plasma region 433 is located closer to the first plasma region 415 than the remote plasma system (RPS) 400, leaving less time for the excited species to leave excited states through collisions with other gas molecules, walls of the chamber and surfaces of the showerhead.

The uniformity of the concentration of the excited species derived from the process gas may also be increased within the second plasma region 433. This may result from the shape of the first plasma region 415, which is more similar to the shape of the second plasma region 433. Excited species created in the remote plasma system (RPS) 400 travel greater distances in order to pass through holes near the edges of the showerhead 425 relative to species that pass through holes near the center of the showerhead 425. The greater distance results in a reduced excitation of the excited species and, for example, may result in a slower growth rate near the edge of a substrate. Exciting the process gas in the first plasma region 415 mitigates this variation.

In addition to the process gas and silicon-containing precursor there may be other gases introduced at varied times for varied purposes. A treatment gas may be introduced to remove unwanted species from the chamber walls, the substrate, the deposited film and/or the film during deposition. The treatment gas may comprise at least one of the gases from the group: $H_2$, an $H_2/N_2$ mixture, $NH_3$, $NH_4OH$, $O_3$, $O_2$, $H_2O_2$ and water vapor. A treatment gas may be excited in a plasma and then used to reduce or remove a residual organic content from the deposited film. In other disclosed embodiments the treatment gas may be used without a plasma. When the treatment gas includes water vapor, the delivery may be achieved using a mass flow meter (MFM) and injection valve or by commercially available water vapor generators.

FIG. 4B is a cross-sectional view of a process chamber with a plasma in the second plasma region 433 consistent with the switch position shown in FIG. 3B. A plasma may be used in the second plasma region 433 to excite a treatment gas delivered through the tubes 430 extending from the sides 435 of the processing chamber. Little or no plasma is present in the first plasma region 415 due to the position of the switch (FIG. 3B). Excited species derived from the treatment gas react with the film on the substrate 455 and remove organic compounds from the deposited film. Herein this process may be referred to as treating or curing the film.

The tubes 430 in the second plasma region 433 comprise insulating material, such as aluminum nitride or aluminum oxide, in some disclosed embodiments. An insulating material reduces the risk of sparking for some substrate processing chamber architectures.

The treatment gas may also be introduced through the gas inlet assembly 405 into the first plasma region 415. In disclosed embodiments the treatment gas may be introduced through the gas inlet assembly 405 alone or in combination with a flow of treatment gas through the tubes 430 extending from the walls 435 of the second plasma region 433. A treatment gas flowing through the first plasma region 415 and then through the showerhead 430 to treat a deposited film may be excited in a plasma in the first plasma region 415 or alternatively in a plasma in the second plasma region 433.

In addition to treating or curing the substrate 455, a treatment gas may be flowed into the second plasma region 433 with a plasma present to clean the interior surfaces (e.g. walls 435, showerhead 425, pedestal 465 and tubes 430) of the second plasma region 433. Similarly, a treatment gas may be flowed into the first plasma region 415 with a plasma present to clean the interior of the surfaces (e.g. lid 412, walls 420 and showerhead 425) of the first plasma region 415. In disclosed embodiments, a treatment gas is flowed into the second plasma region 433 (with a plasma present) after a second plasma region maintenance procedure (clean and/or season) to remove residual fluorine from the interior surfaces of the second plasma region 433. As part of a separate procedure or a separate step (possibly sequential) of the same procedure, the treatment gas is flowed into the first plasma region 415 (with a plasma present) after a first plasma region maintenance procedure (clean and/or season) to remove residual fluorine from the interior surfaces of the first plasma region 415. Generally, both regions will be in need of cleaning or seasoning at the same time and the treatment gas may treat each region sequentially before substrate processing resumes.

Figure 5:
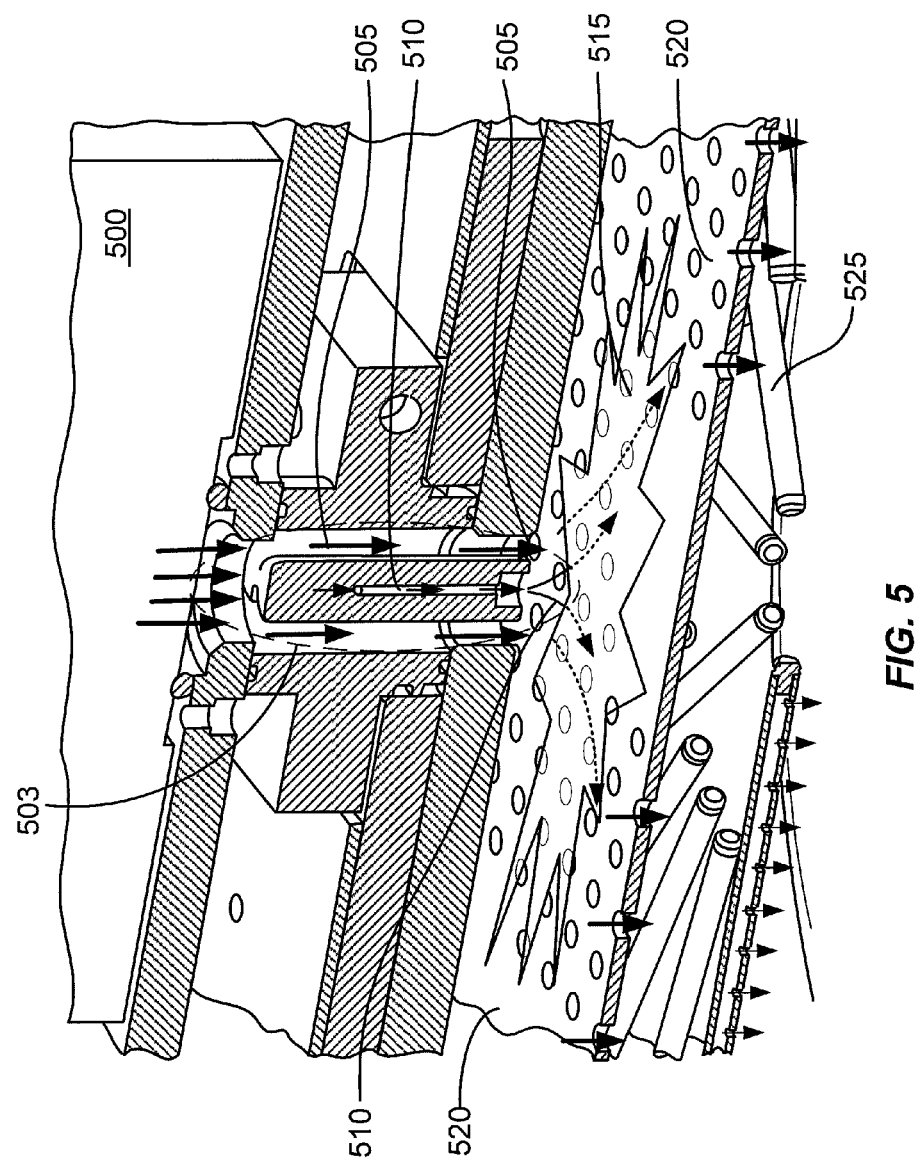
FIG. 5 is a close-up perspective view of a gas inlet and first plasma region according to disclosed embodiments.

The aforementioned treatment gas processes use a treatment gas in process steps distinct from the deposition step. A treatment gas may also be used during deposition to remove organic content from the growing film. FIG. 5 shows a close-up perspective view of the gas inlet assembly 503 and the first plasma region 515. The gas inlet assembly 503 is shown in finer detail revealing two distinct gas flow channels 505, 510. In an embodiment, the process gas is flowed into the first plasma region 515 through an exterior channel 505. The process gas may or may not be excited by the RPS 500. A treatment gas may flow into the first plasma region 515 from an interior channel 510, without being excited by the RPS 500. The locations of the exterior channel 505 and the interior channel 510 may be arranged in a variety of physical configurations (e.g. the RPS excited gas may flow through the interior channel in disclosed embodiments) such that only one of the two channels flows through the RPS 500.

Both the process gas and the treatment gas may be excited in a plasma in the first plasma region 515 and subsequently flow into the second plasma region through holes in the showerhead 520. The purpose of the treatment gas is to remove unwanted components (generally organic content) from the film during deposition. In the physical configuration shown in FIG. 5, the gas from the interior channel 510 may not contribute appreciably to the film growth, but may be used to scavenge fluorine, hydrogen and/or carbon from the growing film.

Figure 6A:
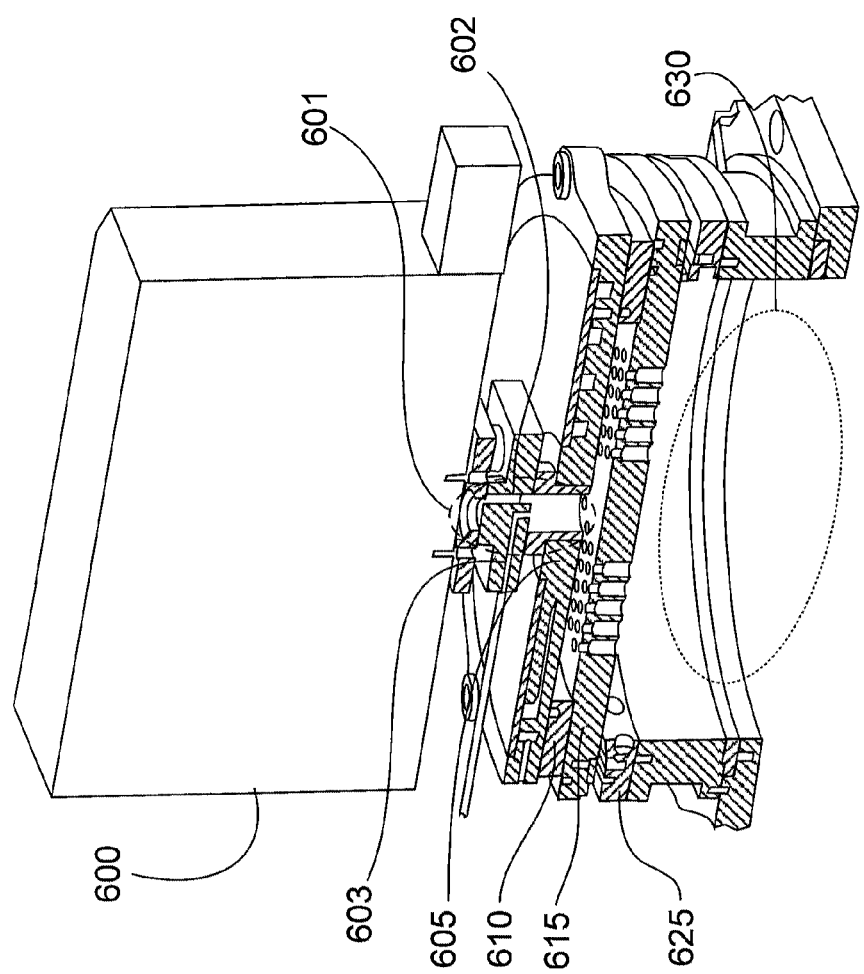
FIG. 6A is a perspective view of a dual-source lid for use with a processing chamber according to disclosed embodiments.
Figure 6B:
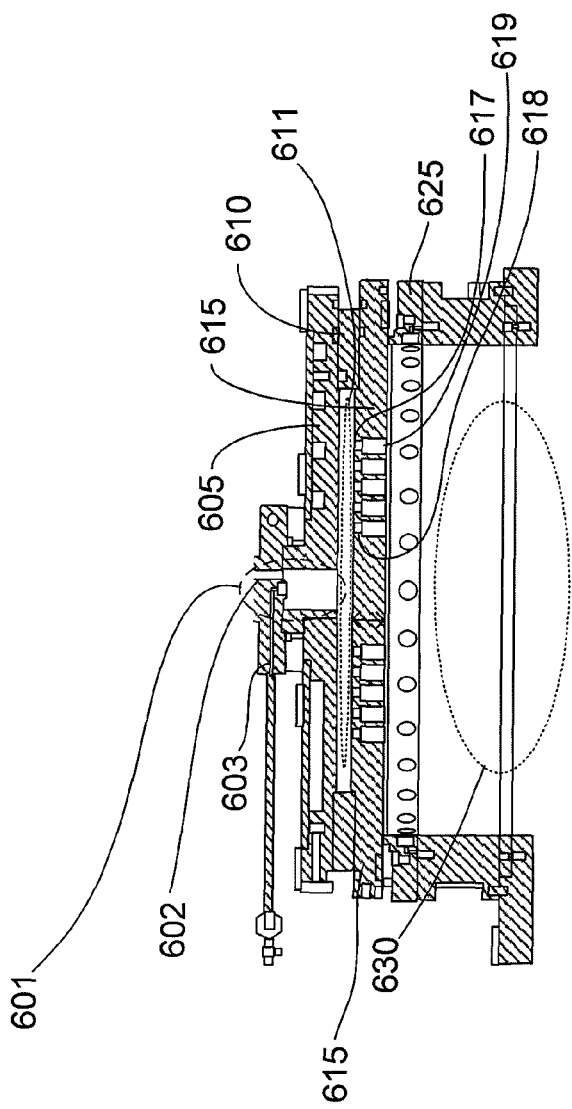
FIG. 6B is a cross-sectional view of a dual-source lid for use with a processing chamber according to disclosed embodiments.

FIG. 6A is a perspective view and FIG. 6B is a cross-sectional view, both of a chamber-top assembly for use with a processing chamber according to disclosed embodiments. A gas inlet assembly 601 introduces gas into the first plasma region 611. Two distinct gas supply channels are visible within the gas inlet assembly 601. A first channel 602 carries a gas that passes through the remote plasma system RPS 600, while a second channel 603 bypasses the RPS 600. The first channel 602 may be used for the process gas and the second channel 603 may be used for a treatment gas in disclosed embodiments. The lid 605 and showerhead 615 are shown with an insulating ring 610 in between, which allows an AC potential to be applied to the lid 605 relative to the showerhead 615. The side of the substrate processing chamber 625 is shown with a gas distribution channel from which tubes may be mounted pointing radially inward. Tubes are not shown in the views of FIGS. 6A-B.

The showerhead 615 of FIGS. 6A-B is thicker than the length of the smallest diameter 617 of the holes in this disclosed embodiment. In order to maintain a significant concentration of excited species penetrating from the first plasma region 611 to the second plasma region 630, the length 618 of the smallest diameter 617 of the holes may be restricted by forming larger holes 619 part way through the showerhead 615. The length of the smallest diameter 617 of the holes may be the same order of magnitude as the smallest diameter 617 of the holes or less in disclosed embodiments.

Figure 7A:
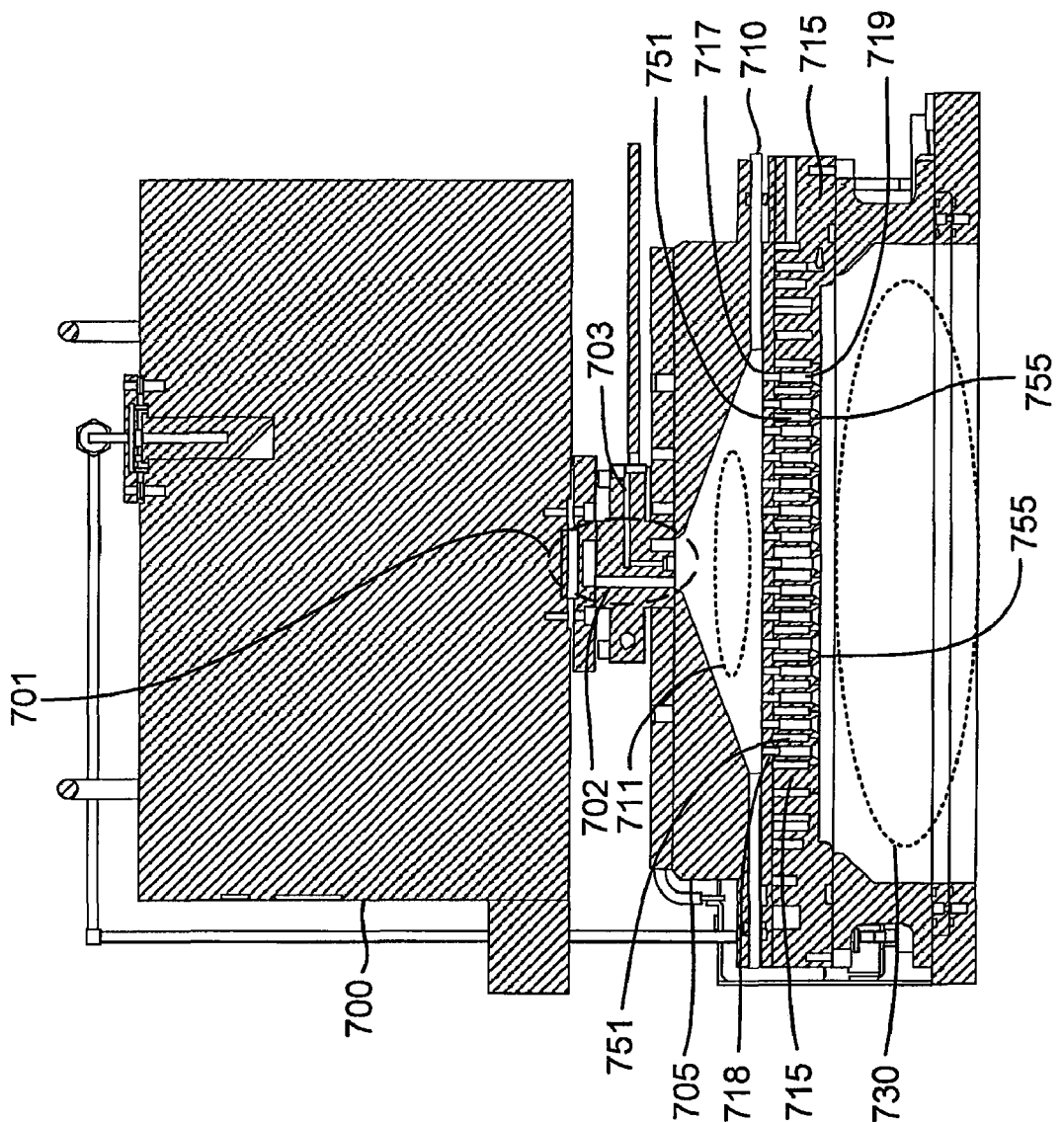
FIG. 7A is a cross-sectional view of a dual-source lid for use with a processing chamber according to disclosed embodiments.

FIG. 7A is another cross-sectional view of a dual-source lid for use with a processing chamber according to disclosed embodiments. A gas inlet assembly 701 introduces gas into the first plasma region 711. Two distinct gas supply channels are visible within the gas inlet assembly 701. A first channel 702 carries a gas that passes through the remote plasma system RPS 700, while a second channel 703 bypasses the RPS 700. The first channel 702 may be used for the process gas and the second channel 703 may be used for a treatment gas in disclosed embodiments. The lid 705 and showerhead 715 are shown with an insulating ring 710 in between, which allows an AC potential to be applied to the lid 705 relative to the showerhead 715.

The showerhead 715 of FIG. 7A has through-holes similar to those in FIGS. 6A-B to allow excited derivatives of gases (such as a process gas) to travel from first plasma region 711 into second plasma region 730. The showerhead 715 also has one or more hollow volumes 751 which can be filled with a vapor or gas (such as a silicon-containing precursor) and pass through small holes 755 into second plasma region 730 but not into first plasma region 711. Hollow volumes 751 and small holes 755 may be used in place of tubes for introducing silicon-containing precursors into second plasma region 730. Showerhead 715 is thicker than the length of the smallest diameter 717 of the through-holes in this disclosed embodiment. In order to maintain a significant concentration of excited species penetrating from the first plasma region 711 to the second plasma region 730, the length 718 of the smallest diameter 717 of the through-holes may be restricted by forming larger holes 719 part way through the showerhead 715. The length of the smallest diameter 717 of the through-holes may be the same order of magnitude as the smallest diameter 617 of the through-holes or less in disclosed embodiments.

In embodiments, the number of through-holes may be between about 60 and about 2000. Through-holes may have a variety of shapes but are most easily made round. The smallest diameter of through holes may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 755 used to introduce a gas into second plasma region 730 may be between about 100 and about 5000 or between about 500 and about 2000 in different embodiments. The diameter of the small holes may be between about 0.1 mm and about 2 mm.

Figure 7B:
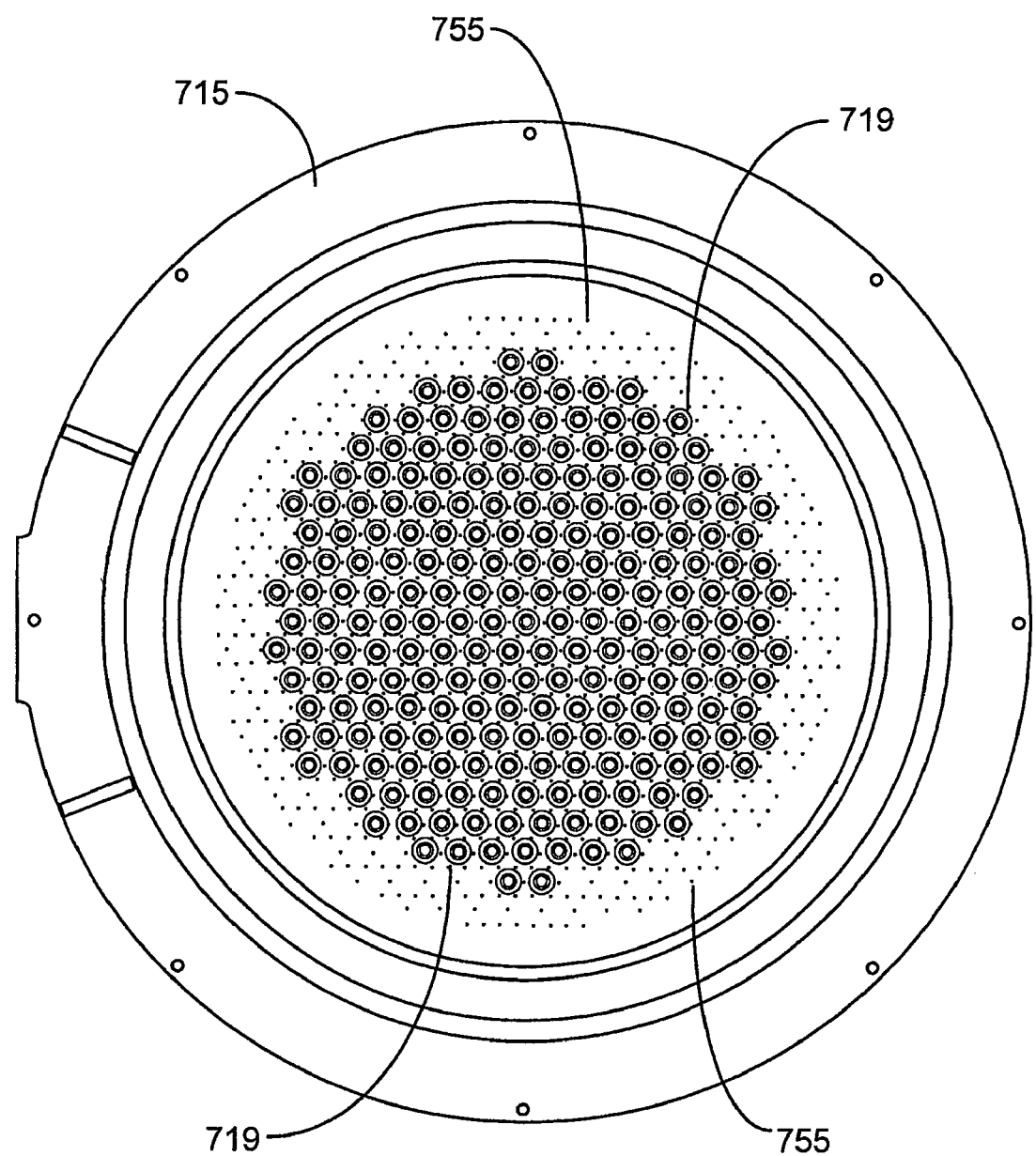
FIG. 7B is a bottom view of a showerhead for use with a processing chamber according to disclosed embodiments.

FIG. 7B is a bottom view of a showerhead 715 for use with a processing chamber according to disclosed embodiments. Showerhead 715 corresponds with the showerhead shown in FIG. 7A. Through-holes 719 have a larger inner-diameter (ID) on the bottom of showerhead 715 and a smaller ID at the top. Small holes 755 are distributed substantially evenly over the surface of the showerhead, even amongst the through-holes 719 which helps to provide more even mixing than other embodiments described herein.

Exemplary Substrate Processing System

Figure 8:
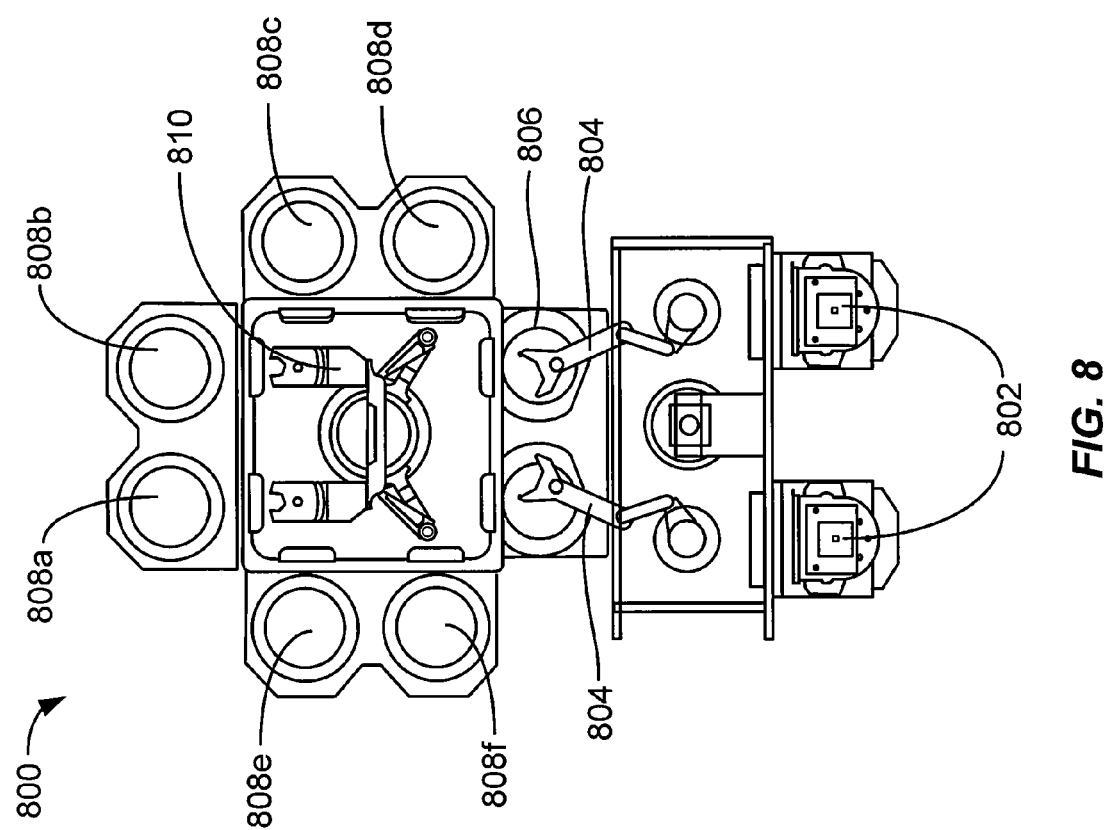
FIG. 8 is a substrate processing system according to disclosed embodiments.

Embodiments of the deposition systems may be incorporated into larger fabrication systems for producing integrated circuit chips. FIG. 8 shows one such system 800 of deposition, baking and curing chambers according to disclosed embodiments. In the figure, a pair of FOUPs (front opening unified pods) 802 supply substrate substrates (e.g., 300 mm diameter wafers) that are received by robotic arms 804 and placed into a low pressure holding area 806 before being placed into one of the wafer processing chambers 808*a-f*. A second robotic arm 810 may be used to transport the substrate wafers from the holding area 806 to the processing chambers 808*a-f* and back.

The processing chambers 808*a-f* may include one or more system components for depositing, annealing, curing and/or etching a flowable dielectric film on the substrate wafer. In one configuration, two pairs of the processing chamber (e.g., 808*c-d* and 808*e-f*) may be used to deposit the flowable dielectric material on the substrate, and the third pair of processing chambers (e.g., 808*a-b*) may be used to anneal the deposited dialectic. In another configuration, the same two pairs of processing chambers (e.g., 808*c-d* and 808*e-f*) may be configured to both deposit and anneal a flowable dielectric film on the substrate, while the third pair of chambers (e.g., 808*a-b*) may be used for UV or E-beam curing of the deposited film. In still another configuration, all three pairs of chambers (e.g., 808*a-f*) may be configured to deposit an cure a flowable dielectric film on the substrate. In yet another configuration, two pairs of processing chambers (e.g., 808*c-d* and 808*e-f*) may be used for both deposition and UV or E-beam curing of the flowable dielectric, while a third pair of processing chambers (e.g. 808*a-b*) may be used for annealing the dielectric film. It will be appreciated, that additional configurations of deposition, annealing and curing chambers for flowable dielectric films are contemplated by system 800.

In addition, one or more of the process chambers 808a-f may be configured as a wet treatment chamber. These process chambers include heating the flowable dielectric film in an atmosphere that include moisture. Thus, embodiments of system 800 may include wet treatment chambers 808a-b and anneal processing chambers 808c-d to perform both wet and dry anneals on the deposited dielectric film.

Figure 9:
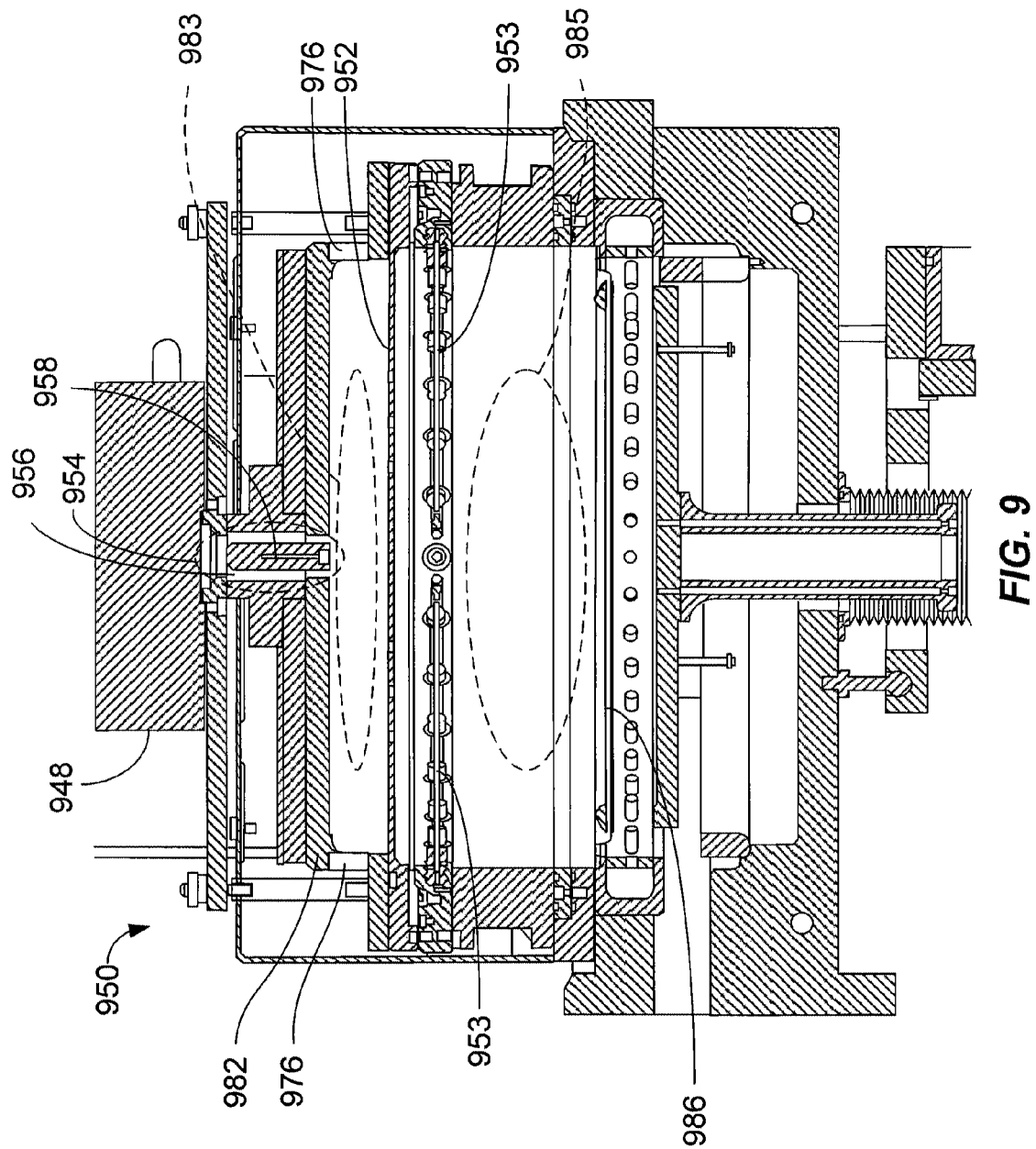
FIG. 9 is a substrate processing chamber according to disclosed embodiments.

FIG. 9 is a substrate processing chamber 950 according to disclosed embodiments. A remote plasma system (RPS) 948 may process a gas which then travels through a gas inlet assembly 954. More specifically, the gas travels through channel 956 into a first plasma region 983. Below the first plasma region 983 is a perforated partition (a showerhead) 952 to maintain some physical separation between the first plasma region 983 and a second plasma region 985 beneath the showerhead 952. The showerhead allows a plasma present in the first plasma region 983 to avoid directly exciting gases in the second plasma region 985, while still allowing excited species to travel from the first plasma region 983 into the second plasma region 985.

The showerhead 952 is positioned above side nozzles (or tubes) 953 protruding radially into the interior of the second plasma region 985 of the substrate processing chamber 950. The showerhead 952 distributes the precursors through a plurality of holes that traverse the thickness of the plate. The showerhead 952 may have, for example from about 10 to 10000 holes (e.g., 200 holes). In the embodiment shown, the showerhead 952 may distribute a process gas which contains oxygen, hydrogen and/or nitrogen or derivatives of such process gases upon excitation by a plasma in the first plasma region 983. In embodiments, the process gas may contain one or more of oxygen ($O_2$), ozone ($O_3$), $N_2O$, NO, $NO_2$, $NH_3$, $N_xH_y$ including $N_2H_4$, silane, disilane, TSA and DSA.

The tubes 953 may have holes in the end (closest to the center of the second plasma region 985) and/or holes distributed around or along the length of the tubes 953. The holes may be used to introduce a silicon-containing precursor into the second plasma region. A film is created on a substrate supported by a pedestal 986 in the second plasma region 985 when the process gas and its excited derivatives arriving through the holes in the showerhead 952 combine with the silicon-containing precursor arriving through the tubes 953.

The top inlet 954 may have two or more independent precursor (e.g., gas) flow channels 956 and 958 that keep two or more precursors from mixing and reaction until they enter the first plasma region 983 above the showerhead 952. The first flow channel 956 may have an annular shape that surrounds the center of inlet 954. This channel may be coupled to the remote plasma system (RPS) 948 that generates a reactive species precursor which flows down the channel 956 and into the first plasma region 983 above the showerhead 952. The second flow channel 958 may be cylindrically shaped and may be used to flow a second precursor to the first plasma region 983. This flow channel may start with a precursor and/or carrier gas source that bypasses a reactive species generating unit. The first and second precursors are then mixed and flow through the holes in the plate 952 to the second plasma region.

The showerhead 952 and top inlet 954 may be used to deliver the process gas to the second plasma region 985 in the substrate processing chamber 950. For example, first flow channel 956 may deliver a process gas that includes one or more of atomic oxygen (in either a ground or electronically excited state), oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 958 may also deliver a process gas, a carrier gas, and/or a treatment gas used to remove an unwanted component from the growing or as-deposited film.

For a capacitively coupled plasma (CCP), an electrical insulator 976 (e.g. a ceramic ring) is placed between the showerhead and the conducting top portion 982 of the processing chamber to enable an voltage difference to be asserted. The presence of the electrical insulator 976 ensures that a plasma may be created by the RF power source inside the first plasma region 983. Similarly, a ceramic ring may also be placed between the showerhead 952 and the pedestal 986 (not shown in FIG. 9) to allow a plasma to be created in the second plasma region 985. This may be placed above or below the tubes 953 depending on the vertical location of the tubes 953 and whether they have metal content which could result in sparking.

A plasma may be ignited either in the first plasma region 983 above the showerhead or the second plasma region 985 below the showerhead and the side nozzles 953. An AC voltage typically in the radio frequency (RF) range is applied between the conducting top portion 982 of the processing chamber and the showerhead 952 to ignite the a plasma in the first plasma region 983 during deposition. The top plasma is left at low or no power when the bottom plasma 985 is turned on to either cure a film or clean the interior surfaces bordering the second plasma region 985. A plasma in the second plasma region 985 is ignited by applying an AC voltage between the showerhead 952 and the pedestal 986 (or bottom of the chamber).

A gas in an "excited state" as used herein describes a gas wherein at least some of the gas molecules are in vibrationally-excited, dissociated and/or ionized states. A gas may be a combination of two or more gases.

Figure 10:
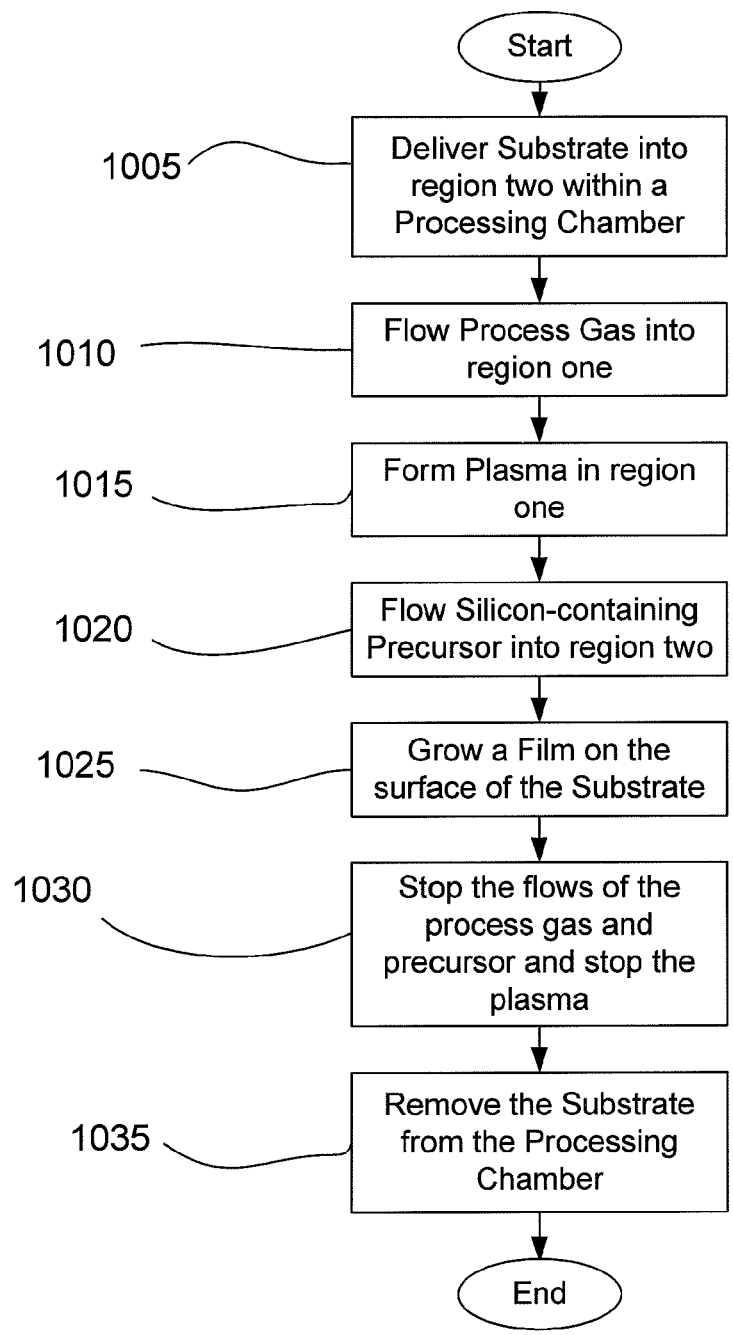
FIG. 10 is a flow chart of a deposition process according to disclosed embodiments.

Disclosed embodiments include methods which may pertain to deposition, etching, curing, and/or cleaning processes. FIG. 10 is a flow chart of a deposition process according to disclosed embodiments. A substrate processing chamber that is divided into at least two compartments is used to carry out the methods described herein. The substrate processing chamber may have a first plasma region and a second plasma region. Both the first plasma region and the second plasma region may have plasmas ignited within the regions.

The process shown in FIG. 10 begins with the delivery of a substrate into a substrate processing chamber (Step 1005). The substrate is placed in the second plasma region after which a process gas may be flowed (Step 1010) into the first plasma region. A treatment gas may also be introduced into either the first plasma region or the second plasma region (step not shown). A plasma may then initiated (Step 1015) in the first plasma region but not in the second plasma region. A silicon-containing precursor is flowed into the second plasma region 1020. The timing and order of steps 1010, 1015 and 1020 may be adjusted without deviating from the spirit of the invention. Once the plasma is initiated and the precursors are flowing, a film is grown 1025 on the substrate. After a film is grown 1025 to a predetermined thickness or for a predetermined time, the plasmas and gas flows are stopped 1030 and the substrate may be removed 1035 from the substrate processing chamber. Before the substrate is removed, the film may be cured in the process described next.

Figure 11:
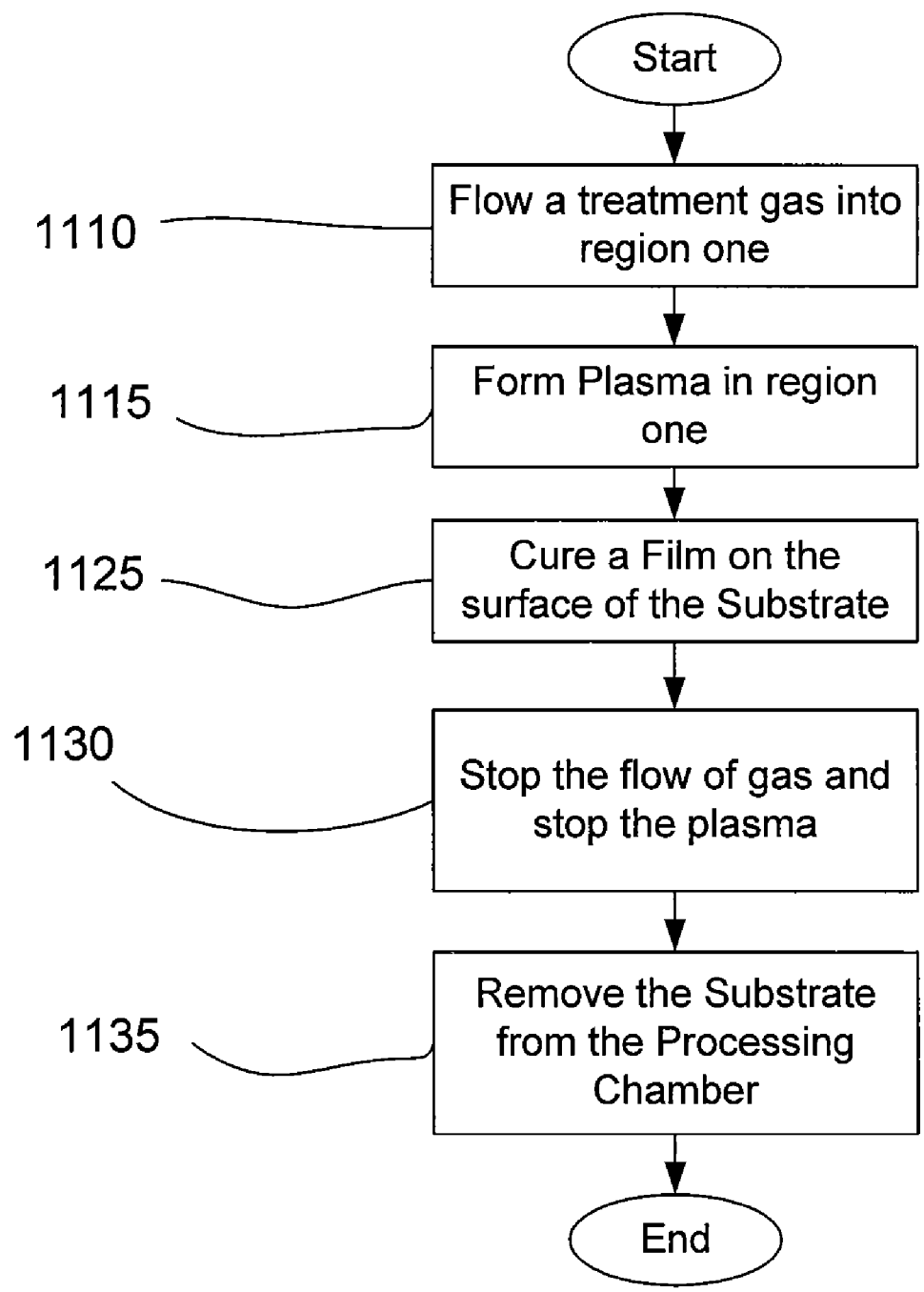
FIG. 11 is a flow chart of a film curing process according to disclosed embodiments.

FIG. 11 is a flow chart of a film curing process according to disclosed embodiments. The start 1100 of this process may be just before the substrate is removed 1035 in the method shown in FIG. 10. This process may also start 1100 by a substrate into the second plasma region of the processing chamber. In this case the substrate may have been processed in another processing chamber. A treatment gas (possible gases described earlier) is flowed 1110 into the first plasma region and a plasma is initiated 1115 in the first plasma region (again the timing/order may be adjusted). Undesirable content in the film is then removed 1125. In some disclosed embodiments, this undesirable content is organic and the process involves curing or hardening 1125 the film on the substrate. The film may shrink during this process. The flow of the gas and the plasma are stopped 1130 and the substrate may be removed 1135 from the substrate processing chamber.

Figure 12:
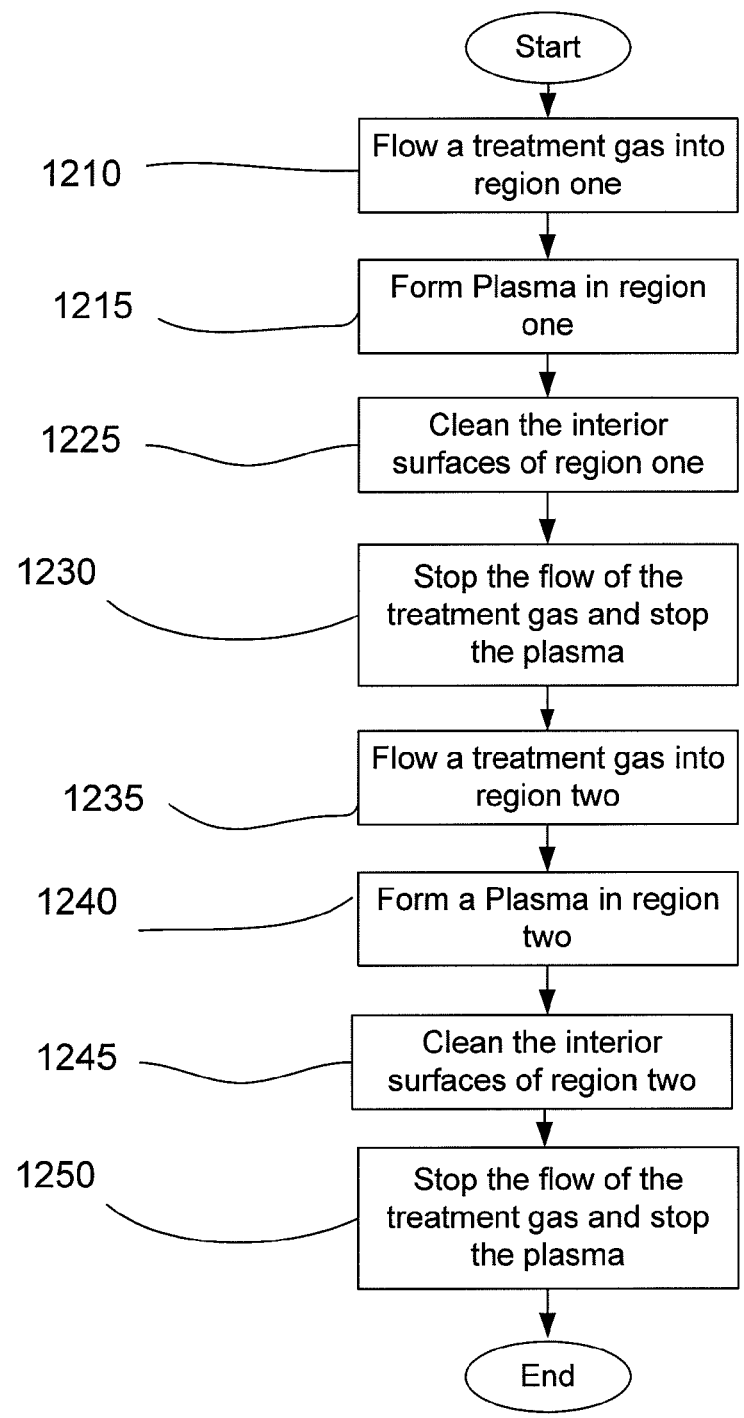
FIG. 12 is a flow chart of a chamber cleaning process according to disclosed embodiments.

FIG. 12 is a flow chart of a chamber cleaning process according to disclosed embodiments. The start 1200 of this process may occur after a chamber is cleaned or seasoned which often occur after a preventative maintenance (PM) procedure or an unplanned event. Because the substrate processing chamber has two compartments which may not be able to support plasmas in the first plasma region and the second plasma region simultaneously, a sequential process may be needed to clean both regions. A treatment gas (possible gases described earlier) is flowed 1210 into the first plasma region and a plasma is initiated 1215 in the first plasma region (again the timing/order may be adjusted). The interior surfaces within the first plasma region are cleaned 1225 before the flow of the treatment gas and the plasma are stopped 1230. The process is repeated for the second plasma region. The treatment gas is flowed 1235 into the second plasma region and a plasma is initiated 1240 therein. The interior surfaces of the second plasma region are cleaned 1245 and the treatment gas flow and plasma are stopped 1250. Interior surface cleaning procedures may be conducted to clean fluorine from the interior surfaces of the substrate processing chamber as well as other leftover contaminants from troubleshooting and maintenance procedures.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing and curing a dielectric material on a substrate, the method comprising the steps of:
providing a processing chamber partitioned into a first plasma region and a second plasma region;
delivering the substrate to the processing chamber, wherein the substrate occupies a portion of the second plasma region;
forming a first plasma in the first plasma region while forming little or no plasma in the second plasma region, wherein the first plasma does not directly contact with the substrate;
depositing the dielectric material on the substrate to form a dielectric layer, wherein one or more reactants excited by the first plasma react with a silicon-containing precursor to deposit the dielectric material, wherein the silicon-containing precursor further comprises carbon and is supplied directly to the second plasma region; and
curing the dielectric layer by forming a second plasma in the second plasma region, wherein one or more carbon-containing species is removed from the dielectric layer.

2. The method of claim 1, wherein the first plasma is formed from a process gas comprising at least one gas selected from the group consisting of $O_2$, $O_3$, $N_2O$, NO, $NO_2$, $NH_3$, $NH_4OH$, silane, disilane, TSA, DSA, —$H_2$, $N_2$, $H_2O_2$ and water vapor.

3. The method of claim 1, wherein the method further comprises etching the dielectric layer with a halogen-containing etchant.

4. The method of claim 3, wherein the halogen-containing etchant comprise fluorine.

5. The method of claim 1, wherein the second plasma is formed from a process gas comprising at least one gas selected from the group consisting of $O_2$, $O_3$, $N_2O$, NO, $NO_2$, $NH_3$, $NH_4OH$, $N_xH_y$, silane, disilane, TSA, DSA, $H_2$, $N_2$, $H_2O_2$ and water vapor.

* * * * *